(12) United States Patent
Partington et al.

(10) Patent No.: US 9,887,143 B2
(45) Date of Patent: Feb. 6, 2018

(54) SURFACE MOUNT DEVICE PACKAGE HAVING IMPROVED RELIABILITY

(71) Applicant: Infineon Technologies Americas Corp., El Segundo, CA (US)

(72) Inventors: Wayne Partington, Worcester, MA (US); Shunhe Xiong, Westford, MA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/081,055

(22) Filed: Mar. 25, 2016

(65) Prior Publication Data
US 2017/0278764 A1    Sep. 28, 2017

(51) Int. Cl.
| | |
|---|---|
| H01L 23/48 | (2006.01) |
| H01L 21/00 | (2006.01) |
| H05K 7/10 | (2006.01) |
| H01L 23/055 | (2006.01) |
| H01L 23/498 | (2006.01) |
| H01L 23/06 | (2006.01) |

(Continued)

(52) U.S. Cl.
CPC ............ *H01L 23/055* (2013.01); *H01L 23/06* (2013.01); *H01L 23/49838* (2013.01); *H01L 23/49866* (2013.01); *H01L 23/562* (2013.01); *H01L 23/585* (2013.01); *H01L 24/48* (2013.01); *H01L 2224/48091* (2013.01); *H01L 2224/48227* (2013.01); *H01L 2924/0105* (2013.01); *H01L 2924/01013* (2013.01); *H01L 2924/01029* (2013.01); *H01L 2924/0132* (2013.01); *H01L 2924/01042* (2013.01); *H01L 2924/01047* (2013.01); *H01L 2924/01074* (2013.01);

(Continued)

(58) Field of Classification Search
CPC . H01L 23/055; H01L 23/06; H01L 23/49838; H01L 23/49866; H01L 23/562; H01L 24/48

See application file for complete search history.

(56) References Cited

U.S. PATENT DOCUMENTS 5,666,004 A * 9/1997 Bhattacharyya ...... H01L 23/642
                                                         257/700
5,977,631 A * 11/1999 Notani .................... H01L 23/66
                                                         257/664

(Continued)

OTHER PUBLICATIONS

Cverna, Fran, ASM Ready Reference, "Thermal Properties of Metals," ASM International, Dec. 2002, 9 pages.

(Continued)

*Primary Examiner* — Alonzo Chambliss
(74) *Attorney, Agent, or Firm* — Slater Matsil, LLP (57) ABSTRACT

A semiconductor package for mounting to a printed circuit board (PCB) includes a case comprising a ceramic base, a semiconductor die in the case, a mounting pad under the ceramic base and coupled to the semiconductor die through at least one opening in the ceramic base. The mounting pad includes at least one layer having a coefficient of thermal expansion (CTE) approximately matching a CTE of the ceramic base. The mounting pad includes at least one layer having a low-yield strength of equal to or less than 200 MPa. The mounting pad includes at least one copper layer and at least one molybdenum layer. The semiconductor package also includes a bond pad coupled to another mounting pad under the ceramic base through a conductive slug in the ceramic base.

26 Claims, 4 Drawing Sheets

(51) Int. Cl.
*H01L 23/00* (2006.01)
*H01L 23/58* (2006.01)

(52) U.S. Cl.
CPC .......... *H01L 2924/01079* (2013.01); *H01L 2924/01082* (2013.01); *H01L 2924/01403* (2013.01); *H01L 2924/01404* (2013.01); *H01L 2924/1033* (2013.01); *H01L 2924/10253* (2013.01); *H01L 2924/10272* (2013.01); *H01L 2924/10344* (2013.01); *H01L 2924/1203* (2013.01); *H01L 2924/13055* (2013.01); *H01L 2924/13091* (2013.01); *H01L 2924/351* (2013.01)

(56) References Cited

U.S. PATENT DOCUMENTS

| | | | | |
|---|---|---|---|---|
| 6,844,606 B2 * | 1/2005 | Logsdon | ............. | H01L 23/10 250/338.1 |
| 7,410,829 B2 * | 8/2008 | Tokumitsu | ........... | B81C 1/00333 257/678 |
| 7,692,292 B2 * | 4/2010 | Higashi | ............. | H01L 23/04 257/704 |
| 8,026,595 B2 * | 9/2011 | Takagi | ............... | H01L 23/04 257/704 |
| 8,116,090 B2 * | 2/2012 | Coburn | ............... | H01L 23/552 174/255 |
| 8,592,959 B2 * | 11/2013 | Fujii | ................. | H01L 23/04 257/664 |
| 9,000,543 B2 * | 4/2015 | Jeong | ............... | G01C 19/574 257/415 |
| 2013/0026602 A1 * | 1/2013 | Okamura | ............ | H01L 23/5223 257/532 |

OTHER PUBLICATIONS

Shields, John A., "Applications of Molybdenum Metal and its Alloys." London: International Molybdenum Association, 2013, 44 pages.

* cited by examiner

SURFACE MOUNT DEVICE PACKAGE HAVING IMPROVED RELIABILITY

BACKGROUND

Surface mount device (SMD) packages can be used to house semiconductor devices and directly connect them to printed circuit boards (PCBs). A large number of electronic circuit designs have been using the SMD packages due to various benefits that the surface mount devices can offer. For example, in military and space applications (e.g., high performance vehicles, aircraft, space shuttles and satellites) where high reliability is imperative, SMD packages can provide the robustness necessary in extreme or harsh environments, while offering benefits such as smaller size, lighter weight, and excellent thermal performance.

However, the popularity of the SMD packages has been somewhat hindered by the coefficient of thermal expansion (CTE) incompatibility between different materials used in different portions of a case of a SMD package, and between the SMD package and the PCB material. For example, a conventional SMD package may include Kovar® sidewalls and a ceramic base. While Kovar® and ceramic materials have substantially matched CTEs at room temperature, their CTEs start diverging drastically as temperature increases. Thermal stress can accumulate between the sidewalls and the base as they expand and contract during fabrication processes and thermal cycles. In addition, when a conventional SMD package is mounted onto a PCB, a CTE mismatch between the conventional SMD package and the PCB may introduce mounting stress to the SMD package. These stresses can cause fatigue and cracking of the SMD package, which in turn can result in hermeticity loss of the SMD package and damage to the semiconductor devices and circuitry inside the SMD package.

Accordingly, there is a need to overcome the drawbacks and deficiencies in the art by providing a semiconductor package, such as a SMD package, that can substantially reduce fatigue and cracking of the semiconductor package due to thermal and mounting stresses.

SUMMARY

The present disclosure is directed to a surface mount device (SMD) package having improved reliability, substantially as shown in and/or described in connection with at least one of the figures, and as set forth in the claims.

DETAILED DESCRIPTION

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Figure 1A:
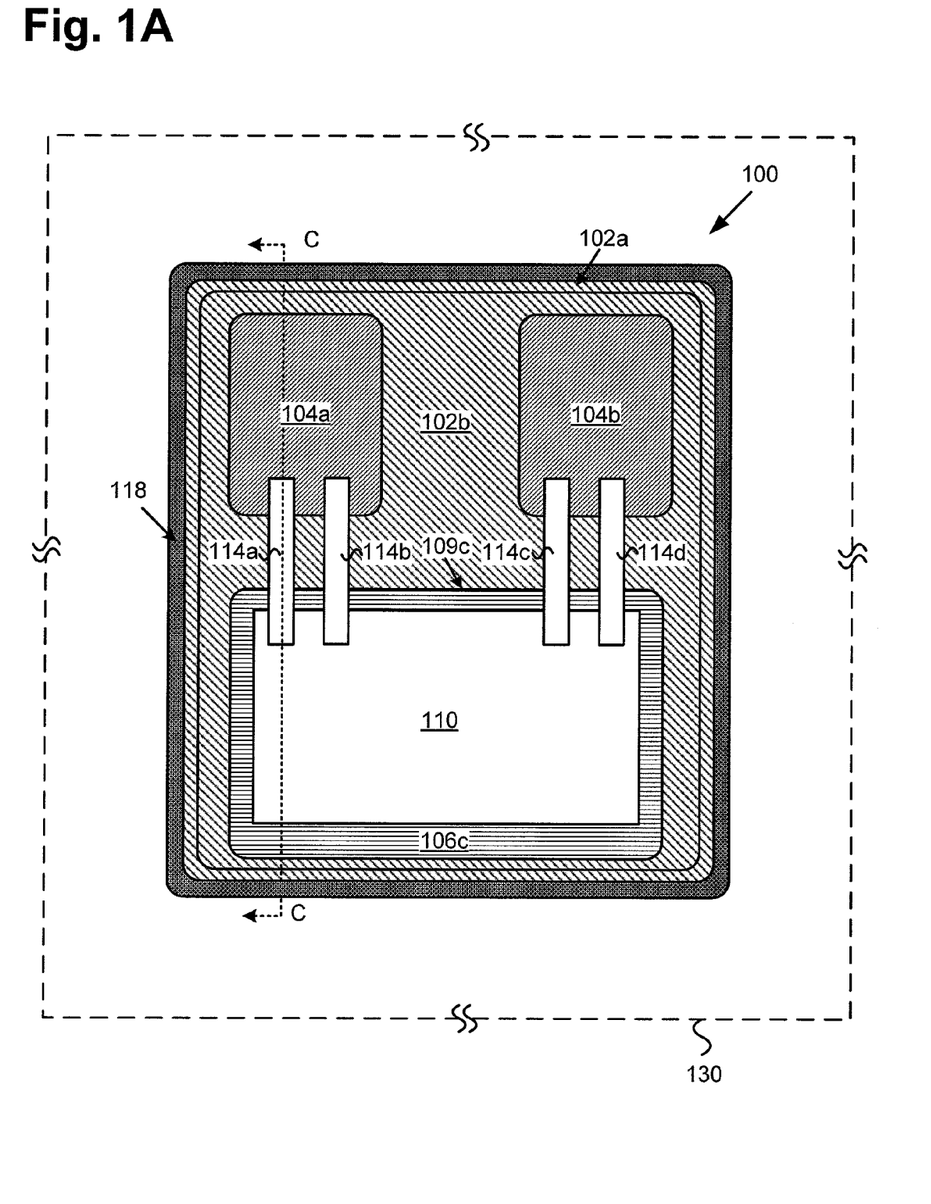
FIG. 1A illustrates a top plan view of a portion of an exemplary semiconductor package, according to one implementation of the present application.
Figure 1B:
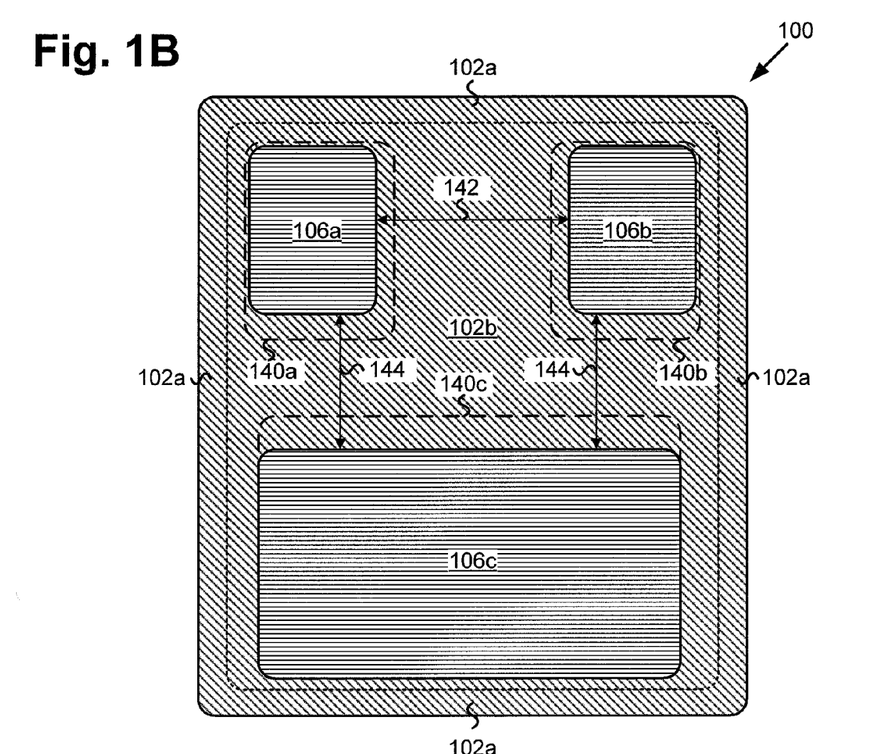
FIG. 1B illustrates a bottom plan view of a portion of an exemplary semiconductor package, according to one implementation of the present application.
Figure 1C:
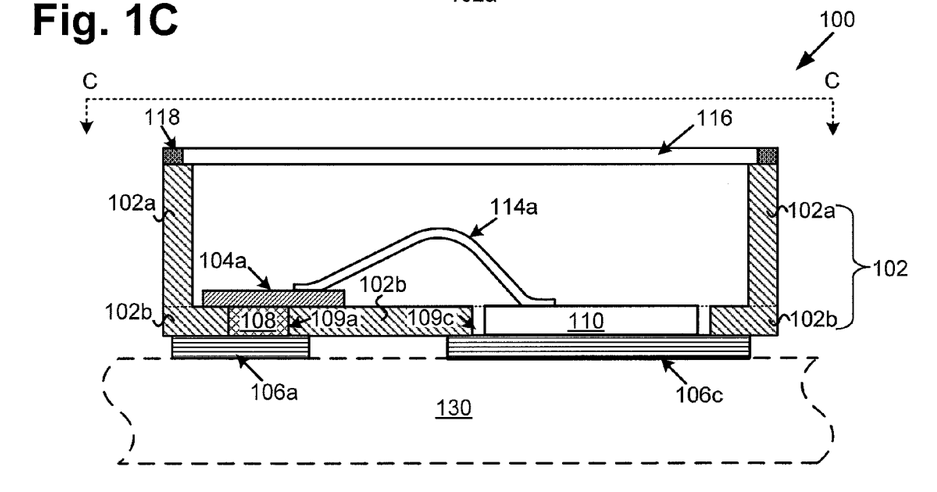
FIG. 1C illustrates a cross-sectional view of a portion of an exemplary semiconductor package, according to one implementation of the present application.

Referring to FIGS. 1A, 1B and 1C, FIG. 1A illustrates a top plan view of a portion of exemplary semiconductor package 100, according to one implementation of the present application. FIG. 1B illustrates a bottom plan view of a portion of exemplary semiconductor package 100, according to one implementation of the present application. FIG. 1C illustrates a cross-sectional view of exemplary semiconductor package 100 in FIG. 1A along line C-C, according to one implementation of the present application. As illustrated in FIGS. 1A-1C, semiconductor package 100 includes case 102 having sidewalls 102a and base 102b, bond pads 104a and 104b on base 102b, mounting pads 106a, 106b and 106c respectively coupled to bond pad 104a, bond pad 104b and semiconductor die 110 at the bottom of case 102, semiconductor die 110 situated in opening 109c of base 102b and on mounting pad 106c, leads 114a and 114b connecting semiconductor die 110 to bond pad 104a, and leads 114c and 114d connecting semiconductor die 110 to bond pad 104b. In one implementation, semiconductor package 100 is surface mounted to substrate 130, such as a printed circuit board.

As illustrated in FIG. 1A, case 102 includes sidewalls 102a and base 102b. In the present implementation, sidewalls 102a and base 102b of case 102 are made of the same material, and have a substantially uniform composition. In an implementation, sidewalls 102a and base 102b include ceramic material. In contrast to conventional SMD packages having sidewalls and a base made of different materials and sintered together at a high temperature (e.g., 780° C.), according the present implementation, sidewalls 102a and base 102b are made from a one-piece body having a substantially uniform composition. For example, case 102 is formed from a single block of ceramic material. Thus, the one-piece body of case 102 can substantially eliminate the CTE mismatch between the sidewalls and the base in conventional SMD packages.

As illustrated in FIG. 1A, bond pads 104a and 104b are situated on base 102b in case 102. Bond pads 104a and 104b may include or may be made of a suitable conductive material such as aluminum (Al), copper (Cu), nickel (Ni), aluminum (Al), titanium (Ti), tungsten (W), or a stack and/or an alloy including one or more of the aforementioned materials. In contrast to conventional SMD packages that only allow a single bond wire to connect a semiconductor die to an external terminal pad through an aperture in the base, according the present implementation bond pads 104a and 104b provide substantially larger wire bonding areas on base 102b (e.g., at least 4 times the wire bonding area as compared to those in conventional SMD packages) for leads, such as leads 114a, 114b, 114c and 114d. As more wire bonding areas are available for making connections between semiconductor die 110 and bond pads 104a and 104b, more bond wires or leads can be employed to increase the current carrying capability and reduce the electrical resistance of semiconductor package 100.

As illustrated in FIG. 1A, semiconductor die 110 is situated in opening 109c of base 102d, and coupled to mounting pad 106c at the bottom of case 102 by, for example, a die attach material (not explicitly shown in FIG. 1A). In the present implementation, bond pad 104a is coupled to a control electrode (e.g., gate electrode) on a top surface semiconductor die 110 through leads 114a and 114b. Bond pad 104b is coupled to a power electrode (e.g., source electrode) on the top surface semiconductor die 110 through leads 114c and 114d. Semiconductor die 110 includes another power electrode (e.g., drain electrode) on a bottom surface thereof, which is electrically and mechanically coupled to mounting pad 106c at the bottom of case 102, for example, by a die attach material (not explicitly shown in FIG. 1C).

In an implementation, semiconductor die 110 includes one or more semiconductor devices (not explicitly shown in FIGS. 1A and 1C). In an implementation, semiconductor die 110 includes group-IV semiconductor material, such as silicon, silicon carbide (SiC), or the like. In another implementation, semiconductor die 110 may include group III-V semiconductor material, such as gallium nitride (GaN), aluminum gallium nitride (AlGaN), or the like. In other implementations, semiconductor die 110 may include any other suitable semiconductor material. Also, semiconductor die 110 may include lateral and/or vertical conduction power semiconductor devices, such as metal-oxide-semiconductor field-effect transistors (FETs), insulated-gate bipolar transistors (IGBTs), power diodes, or the like. In an implementation, semiconductor die may include one or more group III-V power semiconductor devices or group IV power semiconductor devices.

As illustrated in FIG. 1B, mounting pads 106a, 106b and 106c are formed on the bottom of base 102b of case 102, and are configured for surface attachment to a substrate, such as substrate 130 in FIG. 1A. As will be explained with respect to FIGS. 4A, 4B and 4C, mounting pads 106a, 106b and 106c may each include a single layer or a multi-layer configuration. Mounting pads 106a, 106b and 106c may each include a material that has a CTE that is approximately matching a CTE of base 102b to reduce thermal stress between substrate 130 and base 102b. Mounting pads 106a, 106b and 106c may each include another material that has a low-yield strength to reduce mounting stress between substrate 130 and base 102b.

As illustrated in FIG. 1B, areas 140a, 140b and 140c in dashed lines represent the sizes of mounting pads in conventional SMD packages. As can be seen in FIG. 1B, mounting pads 106a, 106b and 106c are smaller than their counter parts in conventional SMD packages. Thus, mounting pads 106a, 106b and 106c are placed farther apart from one another on the bottom side of base 102b. Separation distance 142 between mounting pads 106a and 106b, and separation distance 144 between mounting pads 106a and 106c and between mounting pads 106b and 106c, allow increased distances between the respective mounting pads. As a result, semiconductor package 100 can withstand higher isolation voltages.

As illustrated in FIG. 1C, bond pad 104a is situated on a top surface of base 102b, and is electrically coupled to mounting pad 106a on a bottom surface of base 102b through a conductive slug, such as metallic slug 108, in opening 109a of base 102b. Semiconductor die 110 is situated in opening 109c of base 102b, and electrically coupled to mounting pad 106c on the bottom surface of base 102b. Although not explicitly shown in FIGS. 1A-1C, it should be understood that bond pad 104b (as shown in FIG. 1A) is also situated on the top surface of base 102b, and is electrically coupled to mounting pad 106b (as shown in FIG. 1B) on the bottom surface of base 102b through another conductive slug in another opening of base 102b.

In an implementation, semiconductor die 110, bond pads 104a and 104b, and leads 114a, 114b, 114c and 114d in case 102 are hermetically sealed by seal ring 118 (e.g., a Kovar® seal ring) and lid 116 (e.g., a ceramic lid). It should be understood that semiconductor package 100 having semiconductor die 110, bond pads 104a and 104b, and leads 114a, 114b, 114c and 114d in case 102 may be encased in a molding compound (not explicitly shown in FIGS. 1A-1C), for example, by injection molding.

In an implementation, substrate 130 may be a printed circuit board (PCB) having one or more layers. Substrate 130 may include conductive traces (not explicitly shown in FIGS. 1A and 1C) for electrically connecting various other circuit components and/or semiconductor packages in or on substrate 130. It should also be understood that other circuit components and/or semiconductor packages (not explicitly shown in FIGS. 1A and 1C) can be formed in and/or on substrate 130.

Figure 2:
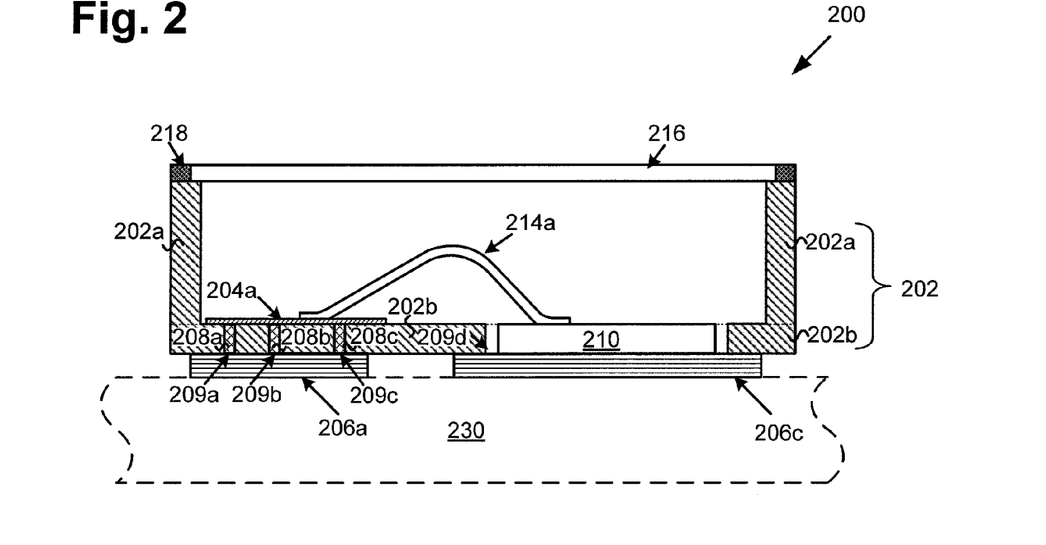
FIG. 2 illustrates a cross-sectional view of a portion of an exemplary semiconductor package, according to one implementation of the present application.

Referring to FIG. 2, FIG. 2 illustrates a cross-sectional view of a portion of an exemplary semiconductor package, according to one implementation of the present application. With similar numerals representing similar features in FIG. 1C, semiconductor package 200 in FIG. 2 includes case 202 having sidewalls 202a and base 202b, bond pad 204a on base 202b, mounting pads 206a and 206c respectively coupled to bond pad 204a and semiconductor die 210, semiconductor die 210 situated in opening 209d of base 202b of case 202, lead 214a connecting semiconductor die 210 to bond pad 204a. In one implementation, semiconductor package 200 is surface mounted to substrate 230, such as a printed circuit board. It should be understood that semiconductor package 200 may have a similar layout as semiconductor package 100 shown in FIGS. 1A and 1B).

As illustrated in FIG. 2, case 202 includes sidewalls 202a and base 202b. In the present implementation, sidewalls 202a and base 202b are made of the same material, and have a substantially uniform composition. In an implementation, sidewalls 202a and base 202b include ceramic material. In an implementation, sidewalls 202a and base 202b are made from a one-piece body having a substantially uniform composition. For example, case 202 is formed from a single block of ceramic material. As discussed above, the one-piece body of case 202 can substantially eliminate the CTE mismatch between the sidewalls and the base in conventional SMD packages.

As illustrated in FIG. 2, bond pad 204a is situated on base 202b of case 202. Bond pad 204a may include a thin plated metallic layer, such as a copper layer, a nickel layer, or a gold layer, that has a very low electrical resistance. Similar to bond pad 104a in FIG. 1C, bond pad 204a can provide substantially larger wire bonding areas on base 202b (e.g., at least 4 times the wire bonding area as compared to those in conventional SMD packages) for leads, such as lead 214a. As more wire bonding areas are available for making connections between semiconductor die 210 and bond pad 204a, more bond wires or leads can be employed to increase the current carrying capability and reduce the electrical resistance of semiconductor package 200.

In the present implementation, bond pad 204a may be coupled to a control electrode (e.g., gate electrode) on a top surface semiconductor die 210 through one or more leads, such as lead 214a. Although not explicitly shown in FIG. 2, it should be understood that semiconductor package 200 may include another bond pad coupled to a power electrode (e.g., source electrode) on the top surface semiconductor die 210 through one or more leads. As illustrated in FIG. 2, semiconductor die 210 is situated in opening 209d of base 202b, and coupled to mounting pad 206c at the bottom of case 202. Semiconductor die 210 includes another power electrode (e.g., drain electrode) on a bottom surface thereof, which is electrically and mechanically coupled to mounting pad 206c at the bottom of case 202, for example, by a die attach material (not explicitly shown in FIG. 2).

In an implementation, semiconductor die 210 includes one or more semiconductor devices (not explicitly shown in FIG. 2). In an implementation, semiconductor die 210 includes group-IV semiconductor material, such as silicon, silicon carbide (SiC), or the like. In another implementation, semiconductor die 210 may include group III-V semiconductor material, such as gallium nitride (GaN), aluminum gallium nitride (AlGaN), or the like. In other implementations, semiconductor die 210 may include any other suitable semiconductor material. Also, semiconductor die 210 may include lateral and/or vertical conduction power semiconductor devices, such as metal-oxide-semiconductor field-effect transistors (FETs), insulated-gate bipolar transistors (IGBTs), power diodes, or the like. In an implementation, semiconductor die may include one or more group III-V power semiconductor devices or group IV power semiconductor devices.

As illustrated in FIG. 2, bond pad 204a is situated on a top surface of base 202b, and is electrically coupled to mounting pad 206a on a bottom surface of base 202b through conductive vias 208a, 208b and 208c in openings 209a, 209b and 209c, respectively, in base 202b. For example, conductive vias 208a, 208b and 208c may each include any suitable metallic material, such as tungsten-molybdenum (WMo) or tungsten-copper (WCu). Semiconductor die 210 is situated in opening 209d of base 202b, and electrically coupled to mounting pad 206c on the bottom surface of base 202b. It should be understood that another bond pad (not explicitly shown in FIG. 2) is also situated on the top surface of base 202b, and is electrically coupled to another mounting pad (not explicitly shown in FIG. 2) on the bottom surface of base 202b through one or more conductive vias (not explicitly shown in FIG. 2) in base 202b.

In the present implementation, semiconductor die 210 may correspond to semiconductor die 110 in FIGS. 1A and 1C. In the present implementation, semiconductor die 210, bond pad 204a, and lead 214a in case 202 are hermetically sealed by seal ring 218 (e.g., a Kovar® seal ring) and lid 216 (e.g., a ceramic lid). It should be understood that semiconductor package 200 having semiconductor die 210, bond pad 204a, and lead 214a in case 202 may be encased in a molding compound (not explicitly shown in FIG. 2), for example, by injection molding.

As illustrated in FIG. 2, mounting pads 206a and 206c are formed on the bottom of base 202b of case 202, and are configured for surface attachment to substrate 230. As will be explained with respect to FIGS. 4A, 4B and 4C, mounting pads 206a and 206c may each include a single layer or a multi-layer configuration. Mounting pads 206a and 206c may each include a material that has a CTE that is approximately matching a CTE of base 202b to reduce thermal stress between substrate 230 and base 202b. Mounting pads 206a and 206c may each include another material that has a low-yield strength to reduce mounting stress between substrate 230 and base 202b. The various configurations and compositions of mounting pads 206a and 206c will be discussed in detail with reference to FIGS. 4A, 4B and 4C below.

Figure 3:
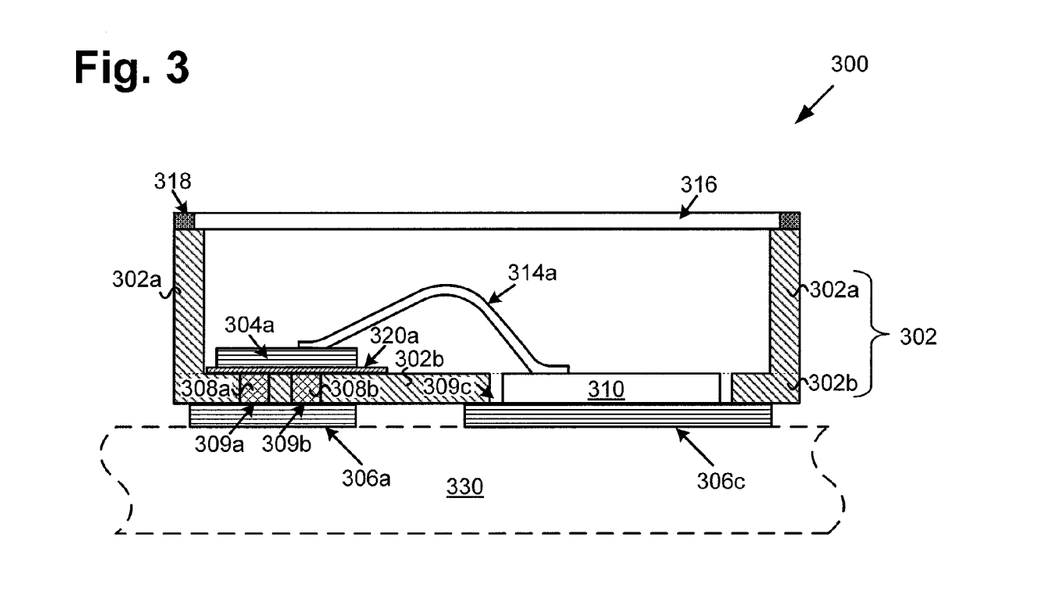
FIG. 3 illustrates a cross-sectional view of a portion of an exemplary semiconductor package, according to one implementation of the present application.

Referring to FIG. 3, FIG. 3 illustrates a cross-sectional view of a portion of an exemplary semiconductor package, according to one implementation of the present application. With similar numerals representing similar features in FIG. 1C, semiconductor package 300 in FIG. 3 includes case 302 having sidewalls 302a and base 302b, bond pad 304a situated on conductive pad 320a over base 302b, mounting pads 306a and 306c respectively coupled to bond pad 304a and semiconductor die 310, semiconductor die 310 situated in opening 309c of base 302b of case 302, lead 314a connecting semiconductor die 310 to bond pad 304a. In one implementation, semiconductor package 300 is surface mounted to substrate 330, such as a printed circuit board. It should be understood that semiconductor package 300 may have a similar layout as semiconductor package 100 shown in FIGS. 1A and 1B).

As illustrated in FIG. 3, case 302 includes sidewalls 302a and base 302b. In the present implementation, sidewalls 302a and base 302b are made of the same material, and have a substantially uniform composition. In an implementation, sidewalls 302a and base 302b include ceramic material. In an implementation, sidewalls 302a and base 302b are made from a one-piece body having a substantially uniform composition. For example, case 302 is formed from a single block of ceramic material. As discussed above, the one-piece body of case 302 can substantially eliminate the CTE mismatch between the sidewalls and the base in conventional SMD packages.

As illustrated in FIG. 3, bond pad 304a is situated on conductive pad 320a. In the present implementation, bond pad 304a may have substantially the same composition as mounting pads 306a and 306c. Conductive pad 320a may include a thin plated metallic layer, such as a copper layer, a nickel layer, or a gold layer, that has a very low electrical resistance. Similar to bond pad 104a in FIG. 1C, bond pad 304a can provide substantially larger wire bonding areas on base 302b (e.g., at least 4 times the wire bonding area as compared to those in conventional SMD packages) for leads, such as lead 314a. As more wire bonding areas are available for making connections between semiconductor die 310 and bond pad 304a, more bond wires or leads can be employed to increase the current carrying capability and reduce the electrical resistance of semiconductor package 300.

In the present implementation, bond pad 304a may be coupled to a control electrode (e.g., gate electrode) on a top surface semiconductor die 310 through one or more leads, such as lead 314a. Although not explicitly shown in FIG. 3, it should be understood that semiconductor package 300 may include another bond pad coupled to a power electrode (e.g., source electrode) on the top surface semiconductor die 310 through one or more leads. As illustrated in FIG. 3, semiconductor die 310 is situated in opening 309c of base 302b, and coupled to mounting pad 306c at the bottom of case 302. Semiconductor die 310 includes another power electrode (e.g., drain electrode) on a bottom surface thereof, which is electrically and mechanically coupled to mounting pad 306c at the bottom of case 302, for example, by a die attach material (not explicitly shown in FIG. 3).

As illustrated in FIG. 3, bond pad 304a is situated on conductive pad 320a over a top surface of base 302b, and is electrically coupled to mounting pad 306a on the bottom surface of base 302b through conductive vias 308a and 308b in openings 309a and 309b, respectively, in base 302b. For example, conductive vias 308a and 308b may each include any suitable metallic material, such as tungsten-molybdenum (WMo) or tungsten-copper (WCu). Semiconductor die 310 is situated in opening 309c of base 302b, and electrically coupled to mounting pad 306c on the bottom surface of base 302b. It should be understood that another bond pad (not explicitly shown in FIG. 3) is also situated on another conductive pad over base 302b, and is electrically coupled to another mounting pad (not explicitly shown in FIG. 3) on the bottom surface of base 302b through one or more conductive vias (not explicitly shown in FIG. 3) in base 302b.

In the present implementation, semiconductor die 310 may correspond to semiconductor die 110 in FIGS. 1A and 1C, and semiconductor die 210 in FIG. 2. In the present implementation, semiconductor die 310, bond pad 304a, conductive pad 320a, and lead 314a in case 302 are hermetically sealed by seal ring 318 (e.g., a Kovar® seal ring) and lid 316 (e.g., a ceramic lid). It should be understood that semiconductor package 300 having semiconductor die 310, bond pad 304a, conductive pad 320a, and lead 314a in case 302 may be encased in a molding compound (not explicitly shown in FIG. 3), for example, by injection molding.

As illustrated in FIG. 3, mounting pads 306a and 306c are formed on the bottom of base 302b of case 302, and are configured for surface attachment to substrate 330. As will be explained with respect to FIGS. 4A, 4B and 4C, mounting pads 306a and 306c may each include a single layer or a multi-layer configuration. Mounting pads 306a and 306c may each include a material that has a CTE that is approximately matching a CTE of base 302b to reduce thermal stress between substrate 330 and base 302b. Mounting pads 306a and 306c may each include another material that has a low-yield strength to reduce mounting stress between substrate 330 and base 302b. The various configurations and compositions of mounting pads 306a and 306c, and bond pad 304a will be discussed in detail with reference to FIGS. 4A, 4B and 4C below.

Figure 4A:
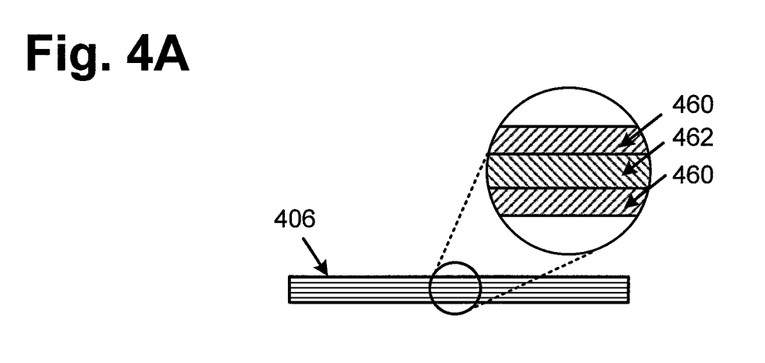
FIG. 4A illustrates a perspective cross-sectional view of a portion of an exemplary mounting pad, according to one implementation of the present application.

Referring to FIG. 4A, FIG. 4A illustrates a perspective cross-sectional view of a portion of an exemplary mounting pad, according to one implementation of the present application. As illustrated in FIG. 4A, mounting pad 406 is a multi-layer laminate mounting pad, which includes top layer 460, middle layer 462 and bottom layer 460. As illustrated in FIG. 4A, top and bottom layers 460 are the outermost layers at the top and bottom of mounting pad 406, respectively. Middle layer 462 is disposed between top and bottom layers 460 in mounting pad 406. In the present implementation, top layer 460, middle layer 462 and bottom layer 460 may include a copper layer, a molybdenum layer, and another copper layer, respectively, for example. In another implementation, top layer 460, middle layer 462 and bottom layer 460 may include a copper layer, a tungsten layer, and another copper layer, respectively, for example.

In the present implementation, mounting pad 406 may correspond to mounting pads 106a, 106b and 106c in FIGS. 1B and 1C, mounting pads 206a and 206c in FIG. 2, and mounting pads 306a and 306c, and bond pad 304a in FIG. 3, for example. It should be understood that mounting pad 406 is configured to be coupled between a base (e.g., base 102b in FIGS. 1A-1C, base 202b in FIG. 2, and base 302b in FIG. 3) of a semiconductor package (e.g., semiconductor package 100 in FIGS. 1A-1C, semiconductor package 200 in FIG. 2, and semiconductor package 300 in FIG. 3) and a substrate (e.g., substrate 130 in FIGS. 1A-1C, substrate 230 in FIG. 2, and substrate 330 in FIG. 3). Mounting pad 406 may include a material that has a CTE that is approximately matching a CTE of the base to reduce thermal stress between the substrate and the base. Mounting pad 406 may include another material that has a low-yield strength to reduce mounting stress between the substrate and the base.

In the present implementation, top and bottom layers 460 each include a low-yield strength material for absorbing mounting stress between the base of the semiconductor package and the substrate. For example, top and bottom layers 460 may each include a low-yield strength material having a Young's modulus of equal to or less than 200 Mpa (200*10$^6$ Pascal). As such, each of top and bottom layers 460 in mounting pad 406 yields at certain stress level and thus limit or mitigate the mounting stress the substrate may exert on the base of the semiconductor package. Materials suitable for top and bottom layers 460 may include, but not limited to, copper, copper alloy, aluminum, aluminum alloy, lead, lead alloy, tin, tin alloy, silver, silver alloy, gold or gold alloy.

In the present implementation, middle layer 462 includes a material that has a CTE that is approximately matching a CTE of the base of the semiconductor package, such that mounting pad 406 has an overall effective CTE that is closely matched to the CTE of the base of the semiconductor package to reduce thermal stress resulted from the CTE mismatch between the substrate and the semiconductor package. Middle layer 462 may have a CTE lower than a CTE of top and bottom layers 460. Middle layer 462 may have a yield strength that is higher than those of top and bottom layers 460. In one implementation, middle layer 462 may have a high-yield strength of Young's modulus of at least 100 GPa (100*10$^9$ Pascal). Materials suitable for middle layer 462 may include, but not limited to, molybdenum, tungsten, copper-molybdenum alloy, copper-tungsten alloy, Kovar®, alloy 52, and alloy 42.

In an implementation, mounting pad 406 may have an effective CTE closely matched (e.g., substantially equal to or slightly different from) to the CTE of the base of the semiconductor package. For example, the base of the semiconductor package has a CTE around 7 ppm/° C. (e.g., an alumina case), while middle layer 462 also has a CTE around 7 ppm/° C. The CTE of middle layer 462 combined with the CTE of top and bottom layers 460, which may be slightly higher than the CTE of middle layer 462 (e.g., 7-10 ppm/° C.), may result in mounting pad 406 having an effective CTE, such as 7-9 ppm/° C., that is closely matched to the CTE of the base of the semiconductor package.

In an implementation, the base of the semiconductor package may have a CTE in a range of 4 to 7 ppm/° C. (e.g., an alumina case having a CTE around 7 ppm/° C.). In an implementation, the substrate may have a CTE in a range of 13 to 18 ppm/° C. (e.g., a FR4 PCB having a CTE of 13 to 14 ppm/° C. or a polyimide PCB having a CTE of 17 to 18 ppm/° C.). Mounting pad 406 may have an effective CTE in a range of 7 to 13 ppm/° C., such as 10 ppm/° C. Thus, mounting pad 406 is configured to substantially reduce and/or minimize the thermal stress resulted from the CTE mismatch between the base of the semiconductor package and the substrate, thereby enhancing the structural integrity of the semiconductor package.

Figure 4B:
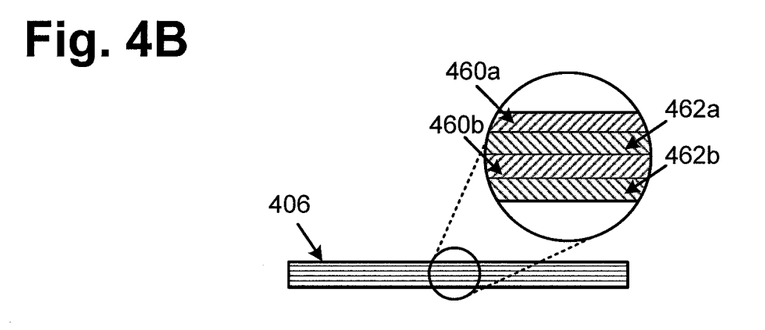
FIG. 4B illustrates a perspective cross-sectional view of a portion of an exemplary mounting pad, according to one implementation of the present application.

Referring to FIG. 4B, FIG. 4B illustrates a perspective cross-sectional view of a portion of an exemplary mounting pad, according to one implementation of the present application. As illustrated in FIG. 4B, mounting pad 406 is a multi-layer laminate mounting pad, which includes layer 460a, layer 462a, layer 460b and layer 462b, successively formed therein. As illustrated in FIG. 4B, layer 460a is the topmost layer in mounting pad 406, and may be configured to be directly attached to a base of a semiconductor package. Layer 462a is formed directly under layer 460a. Layer 460b is formed directly under layer 462a. Layer 462b is the bottommost layer in mounting pad 406, and may be configured to be directly attached to a top surface of a substrate.

In the present implementation, mounting pad 406 may correspond to mounting pads 106a, 106b and 106c in FIGS. 1B and 1C, mounting pads 206a and 206c in FIG. 2, and mounting pads 306a and 306c, and bond pad 304a in FIG. 3, for example. It should be understood that mounting pad 406 is configured to be coupled between a base (e.g., base 102b in FIGS. 1A-1C, base 202b in FIG. 2, and base 302b in FIG. 3) of a semiconductor package (e.g., semiconductor package 100 in FIGS. 1A-1C, semiconductor package 200 in FIG. 2, and semiconductor package 300 in FIG. 3) and a substrate (e.g., substrate 130 in FIGS. 1A-1C, substrate 230 in FIG. 2, and substrate 330 in FIG. 3). Mounting pad 406 may include a material that has a CTE that is approximately matching a CTE of the base to reduce thermal stress between the substrate and the base. Mounting pad 406 may include another material that has a low-yield strength to reduce mounting stress between the substrate and the base.

In the present implementation, layers 460a and 460b each include a low-yield strength material for absorbing mounting stress between the base of the semiconductor package and the substrate. For example, layers 460a and 460b may each include a low-yield strength material having a Young's modulus of equal to or less than 200 Mpa ($200*10^6$ Pascal). As such, each of layers 460a and 460b in mounting pad 406 yields at certain stress level and thus limit or mitigate the mounting stress the substrate may exert on the base of the semiconductor package. Materials suitable for layers 460a and 460b may include, but not limited to, copper, copper alloy, aluminum, aluminum alloy, lead, lead alloy, tin, tin alloy, silver, silver alloy, gold or gold alloy.

In the present implementation, layers 462a and 462b may each include a material that is approximately matching a CTE of the base of the semiconductor package, such that mounting pad 406 has an overall effective CTE that is closely matched to the CTE of the base of the semiconductor package to reduce thermal stress resulted from the CTE mismatch between the substrate and the semiconductor package. Layers 462a and 462b may have a CTE lower than a CTE of layers 460a and 460b. Layers 462a and 462b may each have a yield strength that is higher than those of layers 460a and 460b. In one implementation, layers 462a and 462b may each have a high-yield strength of Young's modulus of at least 100 GPa ($100*10^9$ Pascal). Materials suitable for layers 462a and 462b may include, but not limited to, molybdenum, tungsten, copper-molybdenum alloy, copper-tungsten alloy, Kovar®, alloy 52, and alloy 42.

In an implementation, layers 460a and 460b may each correspond to top or bottom layer 460 in FIG. 4A. In an implementation, layers 462a and 462b may each correspond to middle layer 462 in FIG. 4A. In the present implementation, layers 460a and 460b may each include a copper layer, while layers 462a and 462b may each include a molybdenum layer, for example. In another implementation, layers 460a and 460b may each include a copper layer, while layers 462a and 462b may each include a tungsten layer, for example. In an implementation, mounting pad 406 may only include layer 460a and layer 462a. In another implementation, mounting pad 406 may only include layer 460b and layer 462b. In an implementation, layers 460a and 460b may include the same composition. In another implementation, layers 460a and 460b may include different compositions. In an implementation, layers 462a and 462b may include the same composition. In another implementation, layers 462a and 462b may include different compositions.

Figure 4C:
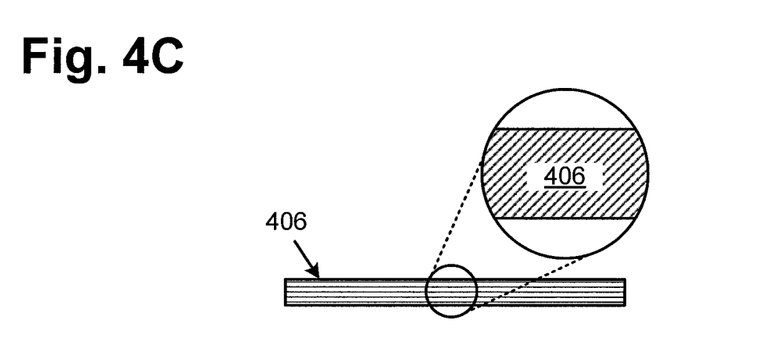
FIG. 4C illustrates a perspective cross-sectional view of a portion of an exemplary mounting pad, according to one implementation of the present application.

Referring to FIG. 4C, FIG. 4C illustrates a perspective cross-sectional view of a portion of an exemplary mounting pad, according to one implementation of the present application. As illustrated in FIG. 4C, mounting pad 406 is a single layer mounting pad. In the present implementation, mounting pad 406 may correspond to mounting pads 106a, 106b and 106c in FIGS. 1B and 1C, mounting pads 206a and 206c in FIG. 2, and mounting pads 306a and 306c, and bond pad 304a in FIG. 3, for example. It should be understood that mounting pad 406 is configured to be coupled between a base (e.g., base 102b in FIGS. 1A-1C, base 202b in FIG. 2, and base 302b in FIG. 3) of a semiconductor package (e.g., semiconductor package 100 in FIGS. 1A-1C, semiconductor package 200 in FIG. 2, and semiconductor package 300 in FIG. 3) and a substrate (e.g., substrate 130 in FIGS. 1A-1C, substrate 230 in FIG. 2, and substrate 330 in FIG. 3). Mounting pad 406 may include a material that has a CTE that is approximately matching a CTE of the base to reduce thermal stress between the substrate and the base. Mounting pad 406 may include another material that has a low-yield strength to reduce mounting stress between the substrate and the base.

In the present implementation, mounting pad 406 includes a first material that has a low-yield strength material for absorbing mounting stress between the base of the semiconductor package and the substrate. For example, the first material may include a low-yield strength material having a Young's modulus of equal to or less than 200 Mpa ($200*10^6$ Pascal). As such, the first material in mounting pad 406 yields at certain stress level and thus limit or mitigate the mounting stress the substrate may exert on the base of the semiconductor package. The first material in mounting pad 406 may include, but not limited to, copper, copper alloy, aluminum, aluminum alloy, lead, lead alloy, tin, tin alloy, silver, silver alloy, gold or gold alloy.

In the present implementation, mounting pad 406 includes a second material that has a CTE that is approximately matching a CTE of the base of the semiconductor package, such that mounting pad 406 has an overall effective CTE that is closely matched to the CTE of the base of the semiconductor package to reduce thermal stress resulted from the CTE mismatch between the substrate and the semiconductor package. The second material has a CTE lower than a CTE of the first material. The second material may have a yield strength that is higher than that of the first material. In one implementation, the second material may have a high-yield strength of Young's modulus of at least 100 GPa ($100*10^9$ Pascal). The second material in mounting pad 406 may include, but not limited to, molybdenum, tungsten, copper-molybdenum alloy, copper-tungsten alloy, Kovar®, alloy 52, and alloy 42.

In one implementation, mounting pad 406 may include a copper molybdenum alloy having a substantially homogeneous composition throughout mounting pad 406. In another implementation, mounting pad 406 may include a copper tungsten alloy having a substantially homogeneous composition throughout mounting pad 406. In other implementations, mounting pad 406 may include other suitable first and second materials described above, and have an inhomogeneous composition.

In an implementation, mounting pad 406 may have an effective CTE closely matched (e.g., substantially equal to or slightly different from) to the CTE of the base of the semiconductor package. For example, the base of the semiconductor package has a CTE around 7 ppm/° C. (e.g., an alumina case), while the second material in mounting pad 406 also has a CTE around 7 ppm/° C. The CTE of the second material in mounting pad 406 combined with the CTE of the first material in mounting pad 406, which may be slightly higher than the CTE of the second material in mounting pad 406 (e.g., 7-10 ppm/° C.), may result in mounting pad 406 having an effective CTE, such as 7-9 ppm/° C., that is closely matched to the CTE of the base of the semiconductor package.

In an implementation, the base of the semiconductor package may have a CTE in a range of 4 to 7 ppm/° C. (e.g., an alumina case having a CTE around 7 ppm/° C.). In an implementation, the substrate may have a CTE in a range of 13 to 18 ppm/° C. (e.g., a FR4 PCB having a CTE of 13 to 14 ppm/° C. or a polyimide PCB having a CTE of 17 to 18 ppm/° C.). Mounting pad 406 may have an effective CTE in a range of 7 to 13 ppm/° C., such as 10 ppm/° C. Thus, mounting pad 406 is configured to substantially reduce and/or minimize the thermal stress resulted from the CTE mismatch between the base of the semiconductor package and the substrate, thereby enhancing the structural integrity of the semiconductor package.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor package for mounting to a printed circuit board (PCB), the semiconductor package comprising:
   a case comprising a ceramic base;
   a semiconductor die in the case; and
   a mounting pad under the ceramic base, and directly coupled to the semiconductor die through at least one opening in the ceramic base, wherein the mounting pad comprises a first metal layer having a coefficient of thermal expansion (CTE) approximately matching a CTE of the ceramic base and a second metal layer contacting the ceramic base and having a yield strength less than the first metal layer, wherein the mounting pad comprises an outer major surface that is configured to be mounted to a circuit board.

2. The semiconductor package of claim 1 wherein the second metal layer has a low-yield strength of equal to or less than 200 Mpa.

3. The semiconductor package of claim 1 wherein the second metal layer comprises a copper layer and the first metal layer comprises a molybdenum layer.

4. The semiconductor package of claim 1 further comprising a bond pad coupled to another mounting pad under the ceramic base through a conductive slug in the ceramic base.

5. The semiconductor package of claim 1 further comprising a bond pad coupled to another mounting pad under the ceramic base through at least one conductive via in the ceramic base.

6. The semiconductor package of claim 5 wherein the bond pad is situated on a conductive pad.

7. The semiconductor package of claim 1 further comprising a seal ring and a lid hermetically sealing the semiconductor die in the case.

8. The semiconductor package of claim 1 wherein the semiconductor die comprises a III-nitride power semiconductor device or a group IV power semiconductor device.

9. The semiconductor package of claim 1 wherein the semiconductor die comprises a power field effect transistor, a power insulated-gate bipolar transistor or a power diode.

10. A surface mount device (SMD) package comprising:
    a case comprising a ceramic base comprising a first major surface and an opposite second major surface;
    a lid hermetically sealing a semiconductor die in the case;
    a bond pad disposed over the first major surface; and
    a mounting pad under the ceramic base, and directly coupled to the semiconductor die, wherein the mounting pad is disposed under the second major surface, wherein the mounting pad comprises an outer major surface that is configured to be mounted to a circuit board,
    wherein the mounting pad comprises at least one layer having a coefficient of thermal expansion (CTE) approximately matching a CTE of the ceramic base.

11. The SMD package of claim 10 wherein the at least one layer comprises copper and at least another layer having molybdenum.

12. The SMD package of claim 10 wherein the mounting pad comprises at least another layer having a low-yield strength.

13. The SMD package of claim 10 wherein the mounting pad comprises at least another layer having a low-yield strength of less than or equal to 200 Mpa.

14. The SMD package of claim 10 further comprising a bond pad coupled to another mounting pad under the ceramic base through a conductive slug in the ceramic base.

15. The SMD package of claim 10 further comprising a bond pad coupled to another mounting pad under the ceramic base through at least one conductive via in the ceramic base.

16. The SMD package of claim 15 wherein the bond pad is situated on a conductive pad.

17. The SMD package of claim 10 wherein the semiconductor die comprises a III-nitride power semiconductor device or a group IV power semiconductor device.

18. The SMD package of claim 10 wherein the semiconductor die comprises a power field effect transistor, a power insulated-gate bipolar transistor or a power diode.

19. The SMD package of claim 10, further comprising:
    a first metal layer contacting the ceramic base and having a yield strength less than the at least one layer; and
    a second metal layer having a yield strength less than the at least one layer, wherein the at least one layer is disposed between the first metal layer and the second metal layer.

20. A surface mount device (SMD) package comprising:
a case comprising a ceramic base and a plurality of sidewalls, the plurality of sidewalls and the ceramic base being formed as a single-piece body;
a semiconductor die disposed in the case surrounded by the plurality of sidewalls and supported by the ceramic base;
a first bond pad disposed over the ceramic base within the case;
a first plurality of leads coupling the first bond pad with the semiconductor die;
a second bond pad disposed over the ceramic base within the case;
a second plurality of leads coupling the second bond pad with the semiconductor die;
a first conductive connector disposed in a first opening in the ceramic base, the first conductive connector coupled to the first bond pad; and
a first mounting pad disposed under the ceramic base, the first mounting pad contacting the first conductive connector and being coupled to the first bond pad through the first conductive connector, wherein the first mounting pad comprises a first metal layer comprising copper, aluminum, lead, tin, silver, or gold, and a second metal layer comprising molybdenum or tungsten, and wherein the first metal layer contacts the ceramic base and the second metal layer; and
a plating layer disposed between the first bond pad and the ceramic base, the plating layer having a larger area than the first bond pad.

21. The SMD package of claim 20, wherein the first metal layer has a yield strength less than the second metal layer, and wherein the second metal layer has a coefficient of thermal expansion (CTE) approximately matching a CTE of the ceramic base.

22. The SMD package of claim 20, further comprising:
a second conductive connector disposed in a second opening in the ceramic base; and
a second mounting pad disposed under the ceramic base, the second mounting pad contacting the first conductive connector and being coupled to the first bond pad through the first conductive connector, wherein the second mounting pad comprises a third metal layer comprising copper, aluminum, lead, tin, silver, or gold, and a fourth metal layer comprising molybdenum or tungsten, wherein the third metal layer contacts the ceramic base and the fourth metal layer, and wherein the second conductive connector is coupled to a major surface of the semiconductor die facing the second mounting pad.

23. The semiconductor package of claim 1 further comprising a third metal layer having a coefficient of thermal expansion (CTE) approximately matching the CTE of the ceramic base, the second metal layer disposed between the first metal layer and the third metal layer.

24. A surface mount device (SMD) package comprising:
a case comprising a ceramic base and a plurality of sidewalls, the plurality of sidewalls and the ceramic base being formed as a single-piece body;
a semiconductor die disposed in the case surrounded by the plurality of sidewalls and supported by the ceramic base;
a first bond pad disposed over the ceramic base within the case;
a first plurality of leads coupling the first bond pad with the semiconductor die;
a first conductive connector disposed in a first opening in the ceramic base, the first conductive connector coupled to the first bond pad;
a first mounting pad disposed under the ceramic base, the first mounting pad contacting the first conductive connector and being coupled to the first bond pad through the first conductive connector, wherein the first mounting pad comprises a first metal layer comprising copper, aluminum, lead, tin, silver, or gold, and a second metal layer comprising molybdenum or tungsten, and wherein the first metal layer contacts the ceramic base and the second metal layer; and
a third metal layer disposed under the second metal layer, the second metal layer disposed between the first metal layer and the third metal layer, the third metal layer comprising having a yield strength less than the second metal layer.

25. The SMD package of claim 24, further comprising:
a fourth metal layer disposed under the third metal layer, the third metal layer disposed between the second metal layer and the fourth metal layer, the fourth metal layer having a CTE approximately matching the CTE of the ceramic base.

26. The SMD package of claim 24, wherein the single-piece body has a substantially uniform composition.

* * * * *